United States Patent [19]
Firtion et al.

[11] 3,976,923
[45] Aug. 24, 1976

[54] PATTERN GENERATING APPARATUS

[75] Inventors: Victor Andrew Firtion, Secaucus; Leif Rongved, Summit; Thomas Edward Saunders, Basking Ridge, all of N.J.

[73] Assignee: Bell Telephone Laboratories, Incorporated, Murray Hill, N.J.

[22] Filed: Apr. 16, 1975

[21] Appl. No.: 568,522

Related U.S. Application Data

[62] Division of Ser. No. 496,150, Aug. 9, 1974, Pat. No. 3,925,785.

[52] U.S. Cl.................................. 318/128; 310/15; 310/30; 310/34; 310/35
[51] Int. Cl.² ........................................ H02K 33/14
[58] Field of Search ........... 318/127, 128, 122, 123, 318/124, 132, 129; 310/15, 17, 19, 20, 23, 24, 34, 35, 50

[56] References Cited
UNITED STATES PATENTS

| | | | |
|---|---|---|---|
| 2,268,687 | 1/1942 | Young .................................. | 310/30 |
| 2,480,451 | 8/1949 | DeLaTorre ....................... | 310/29 X |
| 3,450,215 | 6/1969 | Emery............................... | 310/50 X |
| 3,840,789 | 10/1974 | Dion .................................. | 318/128 |

*Primary Examiner*—Donovan F. Duggan
*Attorney, Agent, or Firm*—R. B. Anderson; L. C. Canepa

[57] ABSTRACT

Integrated circuit mask patterns are laser machined by mounting substrates on a support that is periodically stepped in a *y* direction after each scan by a laser writing beam in an *x* direction. X-direction scanning is accomplished by mounting a mirror on a carriage that reciprocates by rebounding between two displaced coil springs. A coding laser beam is reflected from the carriage through a stationary code plate, comprising alternate transparent and opaque stripes, to monitor the position of the carriage and to control the modulation of the writing beam.

7 Claims, 4 Drawing Figures

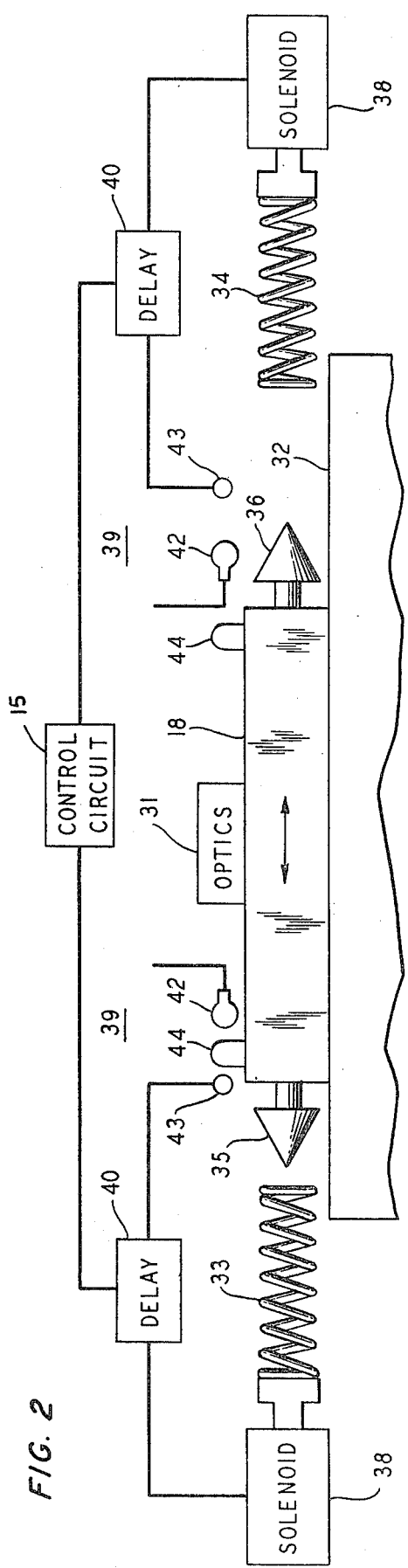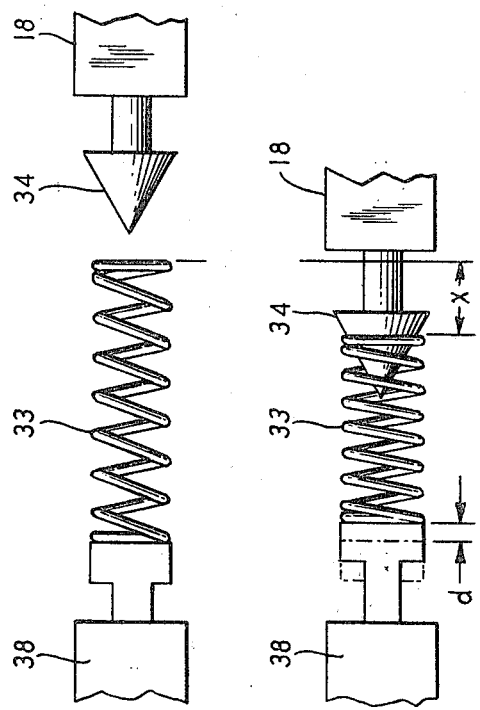

PATTERN GENERATING APPARATUS

CROSS REFERENCE TO RELATED APPLICATION

This application is a division of our copending application, Ser. No. 496,150, filed Aug. 9, 1974 now U.S. Pat. No. 3,925,785, issued Dec. 9, 1975.

BACKGROUND OF THE INVENTION

This invention relates to reproducing apparatus, and more particularly, to apparatus for generating patterns from information stored in a computer or similar storage apparatus.

The fabrication of semiconductor integrated circuits requires repeated projection of light through different masks onto a semiconductor wafer coated with a photosensitive film. After each exposure and appropriate development, the film itself then constitutes a mask for permitting selective processing of the wafer, such as etching or diffusion. The photolithographic mask pattern may be prepared by a draftsman and then photographically reduced to a size appropriate for the production of minuscule integrated circuits.

The patent of Herriott et al. U.S. Pat. No. 3,573,849 granted Apr. 6, 1971 assigned to Bell Telephone Laboratories, Incorporated, describes a pattern generating system using laser beam exposure of a photographic film. The pattern is described entirely by digital information stored in a computer; that is, by trains of stored electrical pulses or "bits" each representing successive spots on a mask pattern that are either transparent or opaque. A positive pulse or one bit may represent a transparent spot, while the absence of a pulse, or zero bit, may represent an opaque spot. The stored information is used to modulate the laser beam which scans the photographic film.

The scanning operation is performed by a rotating polygonal mirror which reflects the beam to scan in an x direction, with the photographic film being periodically stepped in an orthogonal y direction. Because the beam is reflected from a single point on the moving mirror, the mirror rotation would normally give a non-uniform scanning velocity across the photosensitive medium; however, a unique scanning lens is included to adjust and linearize the light beam scanning velocity. Although laser beams are theoretically capable of extremely high resolution, such resolution in the Herriott et al. apparatus, and similar prior art machines, is limited by such factors as the resolution capabilities of the photosensitive medium, the scanning lens, and by the essential change of reflected direction of the writing beam during scanning. Accordingly, masks made by the Herriott apparatus are typically made initially to be 35 times larger than the size of the intended integrated circuit pattern, photographically reduced to a 10:1 ratio, and subsequently reduced again by a step-and-repeat camera to produce a multiple-array mask, each component containing a circuit pattern of the proper size.

SUMMARY OF THE INVENTION

It is an object of this invention to provide apparatus capable of high resolution reproduction of patterns represented by stored electrical information, and more specifically, to provide apparatus capable of generating photolithographic mask patterns.

We have found that x-direction laser beam scanning may be accomplished by mounting a mirror on a carriage that reciprocates by rebounding between two displaced coil springs. The laser beam is directed against the mirror along a line parallel with the direction of motion and, as the moving mirror intercepts the laser beam, it reflects it to describe a scanning line on the substrate. The reflection angle from the mirror is constant during the scan so there is no need for a complex scanning lens as in the Herriott et al. apparatus to linearize the beam velocity.

As the carriage rebounds between the displaced springs, its reciprocating motion is maintained by imparting a small sharp impulse to each spring as such spring is compressed by the carriage. The added impulse is preferably applied by a properly synchronized solenoid which displaces the spring a short distance to impart kinetic energy to the carriage and maintain a predetermined velocity during its traverse. Formulations relating velocity and spring displacement in terms of carriage and spring characteristics will be described in more detail later; sensing apparatus for actuating the solenoid at the proper time during the reciprocating cycle will also be described.

Because there is no need for a scanning lens, the laser beam may be of higher power than was used in the Herriott et al. apparatus. This in turn permits pattern definition by laser machining rather than by photographic exposure. Accordingly, the workpiece is coated with a thin film of a material such as iron oxide which is selectively evaporated by the scanning laser beam to describe the desired pattern. It can be shown that this mechanism is inherently capable of sharper resolution than the photographic exposure technique, which is limited by non-linearities of organic photographic emulsions; also it is mechanically and optionally less complex.

Modulation of the laser beam may be synchronized with the travel of the carriage by a coding technique similar to that described in the Herriott et al. patent. A second laser directs a coding beam to a mirror mounted at 45° on the carriage, which reflects it through a code plate comprised of alternate transparent and opaque regions, to a photodetector. As the code beam scans the code plate, it generates a pulse train indicative of the instantaneous location of the carriage, which in turn is used to control the modulation of the laser beam to produce the proper evaporation spots at the proper locations of the workpiece.

Various other objects, features and advantages of the invention will be appreciated from a consideration of the following detailed description taken in conjunction with the accompanying drawing.

DRAWING DESCRIPTION

FIG. 2 is a schematic view of the apparatus of FIG. 1 illustrating other components of the apparatus;

FIGS. 3A and 3B are schematic views illustrating the effects of the coil springs of the apparatus of FIG. 2.

DETAILED DESCRIPTION

Figure 1:
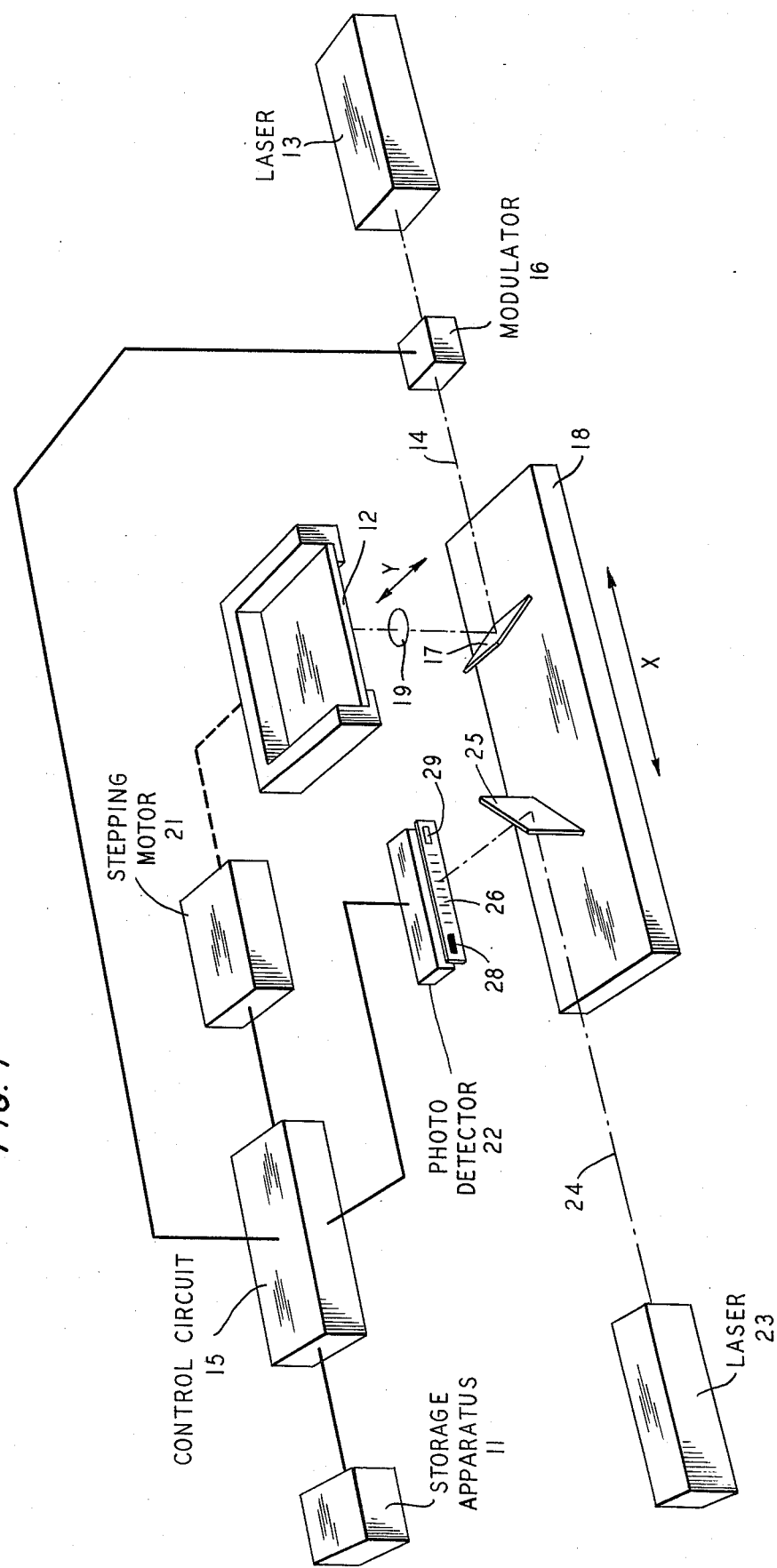
FIG. 1 is a schematic illustration of an illustrative embodiment of the invention.

Referring now to FIG. 1 there is shown a schematic illustration of a pattern generator for reproducing the image of a pattern which is initially stored as electronic data by a storage apparatus 11 on an appropriate medium such as magnetic tape. The pattern to be generated may typically be an integrated circuit configuration consisting only of transparent and opaque regions represented by the digital data; for example, a positive voltage pulse or a one bit represents a transparent spot to be reproduced, while a zero bit, or the absence of a pulse represents an opaque spot. The information is eventually reproduced on the underside of a workpiece 12 which is exposed to light generated by a laser 13. The workpiece may typically be coated with a film of iron oxide which is selectively evaporated by the modulated laser writing beam 14 to describe the desired pattern.

A control circuit 15 periodically causes electronic data from storage apparatus 11 to be transmitted to an optical modulator 16, where it intensity modulates the writing beam 14. Since the modulation information is digital, it may be used simply to switch the beam off and on; for example, a one bit may cause the writing beam to be deflected off-axis, while the zero bit permits the writing beam to be transmitted to the workpiece, or vice versa. The modulator may be either internal or external of the laser package as is known. The modulated writing beam is reflected by a mirror 17 mounted on a carriage 18 at 45°, and after reflection the beam is focused by a lens 19. The design of the laser and accompanying optical components to give high resolution evaporation of an iron oxide film is a matter well understood in the art.

Scanning of the major portion of the bottom surface of the workpiece 12 by laser writing beam 14 is accomplished by causing carriage 18 to reciprocate in an $x$ direction as shown, and by stepping workpiece 12 in a $y$ direction after each $x$ direction scan. The workpiece may be driven in a known manner by a stepping motor 21 controlled by the control circuit 15. The writing beam machines the workpiece as the carriage travels both back and forth.

An input to the control circuit 15 is taken from a photodetector 22 which generates a signal indicative of the x-direction motion of carriage 18. A coding laser 23 directs a code beam 24 to a mirror 25 mounted at 45° with respect to carriage 18, which reflects the beam through a code plate 26 to the photodetector 22. The structure and operation of code plate 26 and associated apparatus may be quite similar to that described in the Herriott et al. patent. As such, it comprises an array of alternately opaque and transparent regions that alternately obstruct and transmit code beam 24 to generate a pulse train that is transmitted to the control circuit 15. The code beam is preferably ribbon-shaped, with the code plate regions in the form of elongated transparent and opaque stripes.

The control circuit 15 may typically comprise a shift register containing a train of information pulses for modulating the laser beam, each of which is gated by a pulse of the coding signal to release an information bit. Appropriate information counters and a "buffer store" device may be used to control transmission of the information from the storage apparatus 11 to the control circuit 15.

Preferably, termination of each scan line is indicated by code areas 28 and 29 on code plate 26. Code region 28 may be opaque, and resultant extended obstruction of code beam 24 indicates that the carriage 18 has completed its scan to the left, while code region 29 is transparent, and the resulting extended code beam transmission indicates the position of carriage 18 at the extreme right. Appropriate programming or construction of control circuit 15 to interpret this data for controlling both the stepping motor 21 and successive scan lines of modulation information is a matter within the skill of a worker in the art. A computer may be programmed to accomplish the above functions, as well as other functions such as error detection and correction, and provide a visual display from which the pattern generation can be monitored. Detailed discussions of these considerations in the context of the apparatus described in the Herriott et al. patent are set forth in the *Bell System Technical Journal*, Vol. 49, No. 9, November 1970, in a series of articles on pages 2011 to 2074.

The apparatus for controlling x-direction reciprocation of carriage 18 in accordance with the invention is shown in FIG. 2. The carriage is preferably designed to include a single housing 31 containing the mirrors 17 and 25 and lens 19 of FIG. 1. The carriage is mounted on an air bearing 32 which constrains it to move along a straight line in the $x$ direction. Since the bearing is an air bearing, the carriage 18 floats on a cushion of air and is free to move in either the positive or negative $x$ direction; there is no direct contact to carriage 18 to control its movement.

Included at opposite ends of the air bearing are a pair of coil springs 33 and 34 for causing the carriage to rebound repeatedly and thereby to reciprocate between the two springs. Bearing surfaces 35 and 36 of the carriage are adapted to contact coil springs 33 and 34 with minimal friction as is illustrated in FIGS. 3A and 3B. Reciprocation may be commenced by simply manually projecting the carriage toward one of the springs; i.e., pushing the carriage with the hand.

While the air bearing and bearing surfaces 35 and 36 minimize friction losses during reciprocation, it is apparent that kinetic energy should be periodically added to the moving carriage 18 to maintain its velocity. This is done in the apparatus of FIG. 2 by solenoids 38, each associated with one of the springs. As the carriage compresses a given spring, the solenoid is actuated to further compress the spring in the $x$ direction, thereby adding energy to the spring which projects the carriage 18 toward the opposite spring. The added energy equals the kinetic energy lost during the previous traverse of the carriage. This action is illustrated in FIGS. 3A and 3B where spring 33 is compressed a distance $x$ by incoming carriage 18 and solenoid 38 provides a rapid small displacement $d$.

It is of course important that the impulses applied by the solenoids to the respective springs be synchronized with the reciprocation of carriage 18. Such synchronization may conveniently be provided by sensors 39 which detect the physical presence of carriage 18 and actuate the solenoid 38 through a delay device 40. Each of the sensors 39 may illustratively comprise a light source 42 in conjunction with a photodetector 43 and a mask 44 attached to the carriage. When the mask 44 obstructs the light beam extending between source 42 and detector 43, an actuating signal is generated. This signal is delayed by circuit 40 for a time sufficient to permit the carriage to compress the spring 33. For example, the circuit 40 may be designed to give a sufficient delay to delay the actuation of the solenoid until the respective spring has reached maximum compression, at which time the impulse imparting the displacement $d$ of FIG. 3B is applied. This imparts maximum kinetic energy to the carriage 18, and if a lesser degree of kinetic energy is desired, the displacement $d$ may be designed to occur at some time either shortly before or shortly after maximum compression of the spring, preferably after maximum compression.

The delay supplied by circuit 40 can be measured either from the time at which contact is made to the spring, or from some time prior to contact. Either of these modes can be exploited to obtain a predictable uniform velocity. The actual delay of course also includes inherent delays of the photodetector and the solenoid.

With the apparatus shown, energy is imparted after each traverse of the carriage, which has been found experimentally to provide a sufficiently uniform velocity through the middle region of the carriage transit to provide highly controlled, high-resolution laser scanning. While the carriage velocity is inherently non-linear due to acceleration and deceleration, such non-linearities are minimized by the low friction bearing system and also by the expedient of excluding from the active scanning region the region where the carriage contacts the springs.

The displacement $d$ of FIG. 3B is exaggerated for purposes of illustration; with a good air bearing and efficient springs, $d$ is extremely small with respect to $x$. The solenoid displacement $d$ is designed to maintain a desired carriage velocity $v$ in accordance with the formula $$d = v \div (2/e)(k/m)^{1/2} \qquad (1)$$

where $e$ is 1 minus the coefficient of restitution of the spring, $k$ is the spring constant and $m$ is the mass of the carriage. This relationship may be understood from the following considerations. The potential energy E stored in any coil spring is given by $$E = \tfrac{1}{2} k x^2 \qquad (2)$$

where $x$ is the deflection of the spring. The kinetic energy K of the carriage is given by $$K = \tfrac{1}{2} m v^2 . \qquad (3)$$

When the carriage comes momentarily to rest at the end of its traverse, its kinetic energy is nearly all converted to potential spring energy. Equations (2) and (3) therefore yield a relationship between the table velocity and the maximum deflection $x$ of the spring of $$x = (m/k)^{1/2} v . \qquad (4)$$

A small amount of energy $E_1$ is lost each time the table rebounds from the spring. This loss can be shown to be nearly proportional to the kinetic energy of the table, and is substantially given by $$E_1 = e(\tfrac{1}{2})m v^2 . \qquad (5)$$

The purpose of the solenoid of course is to add a small amount of energy to compensate for the small energy loss $E_1$. If one considers the deflection $d$ to occur at the time of maximum deflection (or compression) of the spring, it can be shown that the energy added $E_a$ is given by $$E_a = k \times d . \qquad (6)$$

One may assume that the friction losses of the air bearing are negligible in which case the carriage arrives at a steady state velocity when the energy added $E_a$ equals the energy lost $E_1$. Then, from Equations (4), (5) and (6) one obtains the relationship of Equation 1. Thus, although the carriage is completely free-moving, its velocity is accurately controllable.

The time T taken to compress fully the spring after initial contact can be shown to be given by $$T = \pi/2 \, (m/k)^{1/2} . \qquad (7)$$

The delay of circuits 40 may be designed to provide precisely the time delay given by Equation (7). Alternatively, with a constant displacement $d$ of the solenoids during each actuation, one can reduce the velocity $v$ of the carriage by providing a time delay that departs slightly from time delay T. Thus, the control circuit 15 is shown as being connected to delay 40 for providing automatic velocity correction of carriage 18. Of course, the greater the solenoid departs from synchronism with the carriage, the more the carriage velocity will be reduced to a lower steady state value. Since, as mentioned before, control circuit 15 may be part of a computer, it is within the skill of the worker in the art to program the computer to monitor carriage velocity and provide this servomechanism function, although it is not essential to the operation of the system. Notice also that time T is independent of carriage velocity, a fact to be considered in placement of sensors 39.

There are a number of other modifications that could be made to the system as described thus far. For example, the workpiece could be mounted on the carriage 18 with the laser beam being stepped periodically in the $y$ direction to give the desired $x$-$y$ scanning. An interferometer location monitoring system of the type described in the Herriott et al. case could be used either in lieu of, or in conjunction with, the code plate monitoring system for monitoring x-direction motion, and could likewise be used for monitoring $y$ direction. In the preferred embodiment, a code plate system is used for monitoring stepping in the $y$ direction as well as in the $x$ direction, but for purposes of simplicity this code plate system has not been shown.

In pattern generating apparatus presently being tested and used experimentally, which has successfully yielded good circuit patterns, the laser cutting tool is a YAG (for yttrium-aluminum-garnet) laser used to vaporize a thin film of iron oxide on glass. The laser is operated in the "cavity dumped" mode at a rate of 300 kilohertz and an output of 2 or more watts. The laser beam is focused to an 8-micron spot with a spot separation in $x$ and $y$ directions of 5-microns. The carriage is designed to oscillate at a speed of 50 centimeters per second and the spring and solenoid controls are designed to give a 0.1 percent jitter. The substrate 12 is mounted in a cassette loading device which can receive 3-inch × 3-inch 60 mil substrates. The cassette is driven via a lead screw through a 72:1 reducer by a SLO SYN (trademark of Superior Electric Co.) stepping motor. A code plate encoder mounted on the cassette is capable of measuring 0.5-micron displacements. The electronics are modified to provide a pulse at the end of each 5.0-micron of travel regardless of the number of motor pulses required to complete the step. The time required to make the 5-micron step in the $y$ direction is about 25 milliseconds.

The time required to laser machine a typical 10,000 address-by-10,000 address area is about 40 minutes, and the data required for the 100 million bits of pattern information are stored on a magnetic tape and transmitted to a Hewlett Packard HP 2100 computer via a conventional "DMA channel." This data is moved into 16 bit words and sent out one at a time. The computer interface then shifts the bit to an acoustooptic modulator associated with the laser to control the cutting pulse path.

The photodetectors are standard devices having a sensitivity of ± 2.5 mils which trigger a preset counter used as the delay device 40. The typical delay is 78.0 milliseconds, which is determined by a crystal controlled clock frequency of 10 kilohertz. This provides stability and control for the 50 centimeter per second carriage velocity, with the 0.1 percent jitter as mentioned earlier.

In recent experiments, laser machining speed has been significantly increased by scanning two or three lines simultaneously with the writing beam. This is done by programming the computer to provide y-direction deflection as well as beam modulation. Since the standard YAG laser operates at a 300 kilohertz rate, and the physical speed of the system is such that only a 100 kilohertz machining rate is usable, it is convenient to deflect the beam to machine adjacent areas during a scanning transit. At present, contiguous lines are machined simultaneously only if they are identical; and this is often the case since relatively large areas of transparency must often be defined. Moreover, it is convenient to program the computer to give this simultaneous machining if two or three lines are identical, and to give only single line scanning if differences occur. It has been found that the time to generate a typical pattern may be reduced from 40 minutes to about 15 minutes with this expedient. The computer program is also defined to give some x-direction deflection to compensate for the carriage velocity and to align the spots of the three scan lines that are being simultaneously machined. When two or three lines are machined simultaneously, the computer likewise controls y-direction stepping to give a 10- or 15-micron step at the completion of the scan, as the case may be.

The y-direction deflection for giving three-line scanning is accomplished by an acoustooptic deflector located in the writing beam path. A voltage controlled oscillator with a center frequency of 40 megahertz and a stability of ± 0.02 percent per day (Greenray Industries, Inc. Model Ph-284) has been found to be appropriate for controlling the deflector. A digital-to-analog converter circuit has been designed to provide a "stairstep" output to correspond to the one, two or three scan line machining cycle. After formation, the pattern generated is reduced in a step-and-repeat camera by a ratio of 10:1 to give a multiplicity of identical mask patterns suitable for superimposition on a semiconductor wafer as is conventional in the art.

The foregoing has been presented to illustrate how a unique carriage system can be used to increase significantly the convenience and accuracy with which intricate photolithographic mask patterns may be generated. Many of the features described are of course not essential to the operation of the apparatus and are given merely for purposes of illustration. Numerous other embodiments and modifications may be made by those skilled in the art without departing from the spirit and scope of the invention.

What is claimed is:

1. In combination:
a carriage;
apparatus for causing the carriage to reciprocate between first and second laterally spaced apart locations comprising a first spring located at the first location and a second spring located at the second location, the distance between the first and second springs being substantially in excess of the lateral extent of the carriage;
a bearing surface between the first and second locations;
the carriage being mounted on the bearing surface and being adapted to reciprocate between the first and second springs, the first and second springs being spaced apart sufficiently far to allow the carriage to move over a substantial portion of its reciprocating travel in a free-moving and low-friction way on the bearing surface with no direct contact with the first and second springs;
and means for imparting energy to at least one of the springs in synchronism with the reciprocation, thereby to maintain reciprocation uniformity.

2. The combination of claim 1 wherein:
the energy imparting means comprises means for displacing each spring a distance $d$ in the direction of the opposite spring during the cycle portion of each reciprocation of the carriage at which the carriage contacts such spring.

3. The combination of claim 2 wherein:
each spring comprises a coil spring having an axis parallel to the direction of reciprocation;
during each reciprocation the carriage induces a compression deflection $x$ on each spring;
and the energy imparting means comprises means for imparting energy $E_a$ to each respective spring substantially conforming to the relationship $$E_a = k \times d$$

where $k$ is the spring constant of the spring.

4. The combination of claim 3 wherein:
the spring displacing means comprises means for displacing each spring a distance $d$ substantially conforming to the relation $$d = v \div (2/e) \, (k/m)^{1/2}$$

where $e$ is 1 minus the coefficient of restitution of the spring, $m$ is the mass of the carriage and $v$ is the velocity of the carriage.

5. The combination of claim 4 wherein:
the means for displacing each spring comprises a solenoid actuated by a sensing element adapted to determine the specific location of the carriage.

6. The combination of claim 5 wherein:
the means for displacing each spring further comprises means for actuating the solenoid during substantially the cycle portion at which the carriage has produced a maximum compression on the respective spring.

7. The combination of claim 6 wherein:
the sensing means comprises a photocell;
and the actuating means comprises means for delaying the signal from the photocell prior to actuation of the solenoid.

* * * * *